United States Patent [19]

Schindler

[11] Patent Number: 5,313,083
[45] Date of Patent: May 17, 1994

[54] R.F. SWITCHING CIRCUITS

[75] Inventor: Manfred J. Schindler, Newton, Mass.

[73] Assignee: Raytheon Company, Lexington, Mass.

[21] Appl. No.: 84,790

[22] Filed: Jun. 28, 1993

Related U.S. Application Data

[63] Continuation of Ser. No. 976,297, Nov. 13, 1992, abandoned, which is a continuation of Ser. No. 865,680, Apr. 8, 1992, abandoned, which is a continuation of Ser. No. 617,285, Nov. 16, 1990, abandoned, which is a continuation of Ser. No. 285,173, Dec. 16, 1988, abandoned.

[51] Int. Cl.⁵ .................. H01L 29/48; H01L 29/56; H01L 29/64
[52] U.S. Cl. .................. 257/280; 257/281; 257/472
[58] Field of Search .......... 357/22 I, 22 H, 15, 357/23.14, 4, 23.4, 24; 257/280, 281, 401, 472

[56] References Cited

U.S. PATENT DOCUMENTS

| | | |
|---|---|---|
| 4,083,098 | 4/1978 | Nicholas ..................... 29/578 |
| 4,315,272 | 2/1982 | Vorhaus . |
| 4,364,073 | 12/1982 | Becke et al. ................ 357/23 |
| 4,455,565 | 6/1984 | Goodman et al. ......... 357/23.4 |
| 4,721,983 | 1/1988 | Frazier ....................... 357/4 |

FOREIGN PATENT DOCUMENTS

| | | |
|---|---|---|
| 0081396A3 | 6/1983 | European Pat. Off. . |
| 0330142A2 | 8/1989 | European Pat. Off. . |
| 2550889A1 | 2/1985 | France . |
| 2102546 | 4/1990 | Japan ..................... 257/472 |

OTHER PUBLICATIONS

"Field Effect Type Semiconductor Device", Patent Abstract of Japan, vol. 9, No. 315 (E-365) [2038], Dec. 11, 1985.
"Gallium Arsenide Materials, Devices, and Circuits", edited by M. J. Howes et al., published in 1985.

*Primary Examiner*—William D. Larkins
*Assistant Examiner*—Stephen D. Meier
*Attorney, Agent, or Firm*—R. M. Sharkansky

[57] ABSTRACT

An advanced MESFET switching structure which includes an interdigitated source region and an interdigitated drain region, also includes a gate electrode region disposed between adjacent portions of the interdigitated source and drain regions having a series gate electrode in Schottky barrier contact therewith. The use of the series connect gate electrode rather than conventional parallel coupled gate fingers eliminates the need for an airbridge overlays to interconnect the source regions as in a conventional MESFET transducer. Moreover, the topography permits smaller MESFET structures and thus higher integration of circuits employing the advanced MESFET switch structure. The smaller transistors will also have lower parasitic reactances. In a preferred embodiment, all interconnections for drain, gate, and source electrodes are disposed on the active layer portion of the transistor providing an even smaller transistor structure.

2 Claims, 5 Drawing Sheets

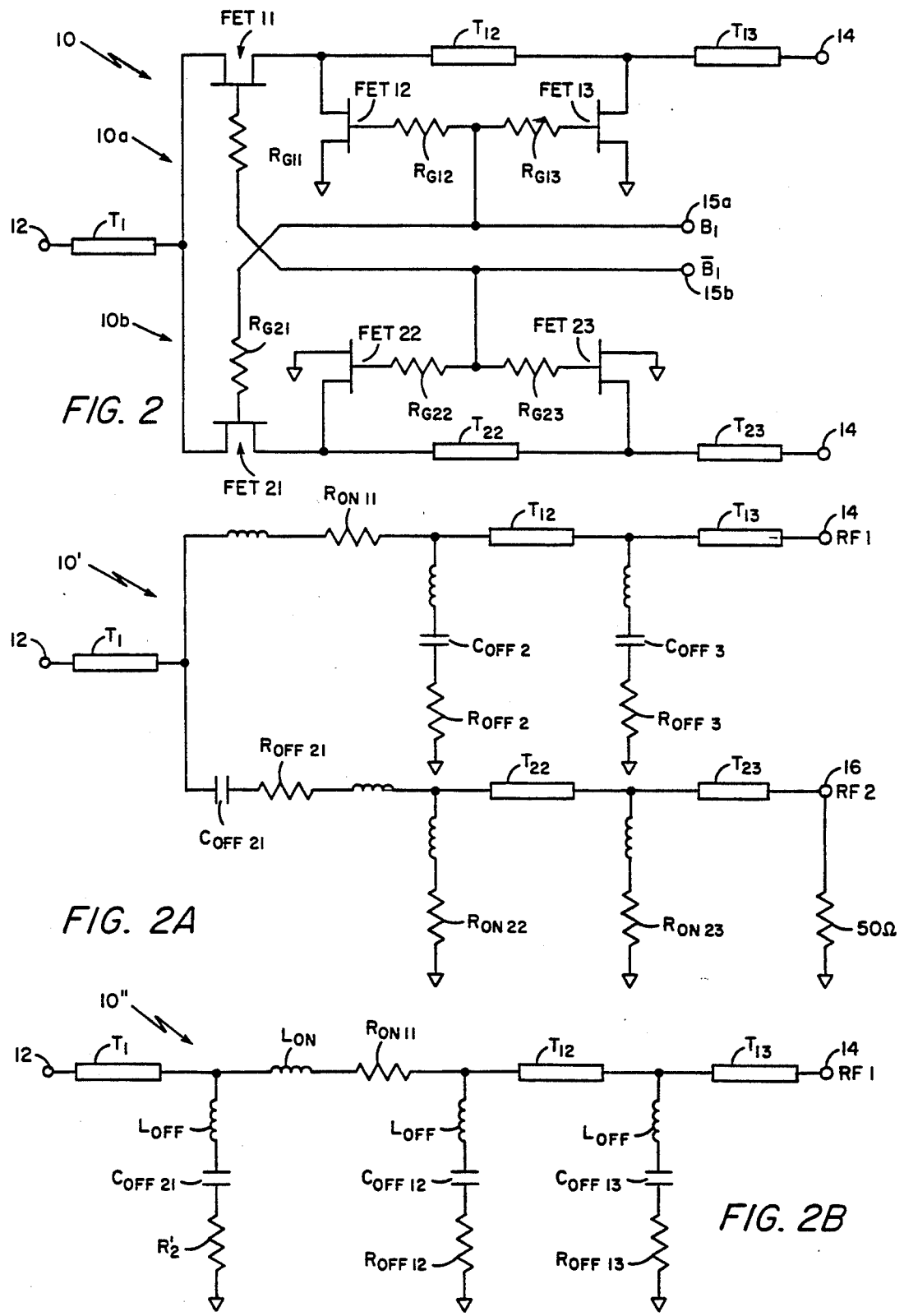

R.F. SWITCHING CIRCUITS

This application is a continuation of application Ser. No. 976,297 filed Nov. 13, 1992 now abandoned, which is a continuation of application Ser. No. 865,680 filed Apr. 8, 1992, now abandoned which is a continuation of application Ser. No. 617,285 filed Nov. 16, 1990, now abandoned which is a continuation of application Ser. No. 285,173 filed Dec. 16, 1988 now abandoned.

BACKGROUND OF THE INVENTION

This invention relates generally to monolithic microwave integrated circuits and in particular to field effect transistor structures used for monolithic microwave integrated circuit switches.

As it is known in the art, r.f. switches are used in a variety of r.f. signal processing applications. As is also known, monolithic microwave integrated circuit technology has been developed to provide monolithic circuit components that is, amplifiers, switches and the like to process analog signals at high operating frequencies.

One of the most common active devices employed in monolithic microwave integrated circuits is the field effect transistor. The most common transistor type is the so-called MESFET (metal electrode semiconductor field effect transistor) which includes a metal Schottky barrier contact to a n-type semiconductor material, and ohmic source and drain electrode contacts. MESFETS are employed because they are readily integrated in integrated circuits particularly with so-called gallium arsenide integrated circuits, the preferred material for use in monolithic microwave integrated circuits. Also used in MMIC's is the so-called HEMT (high electron mobility transistor). HEMT's and psuedomorphic HEMT's use hetro structures of alternating layers of GaAs, AlGaAs and InGaAs, for example, in the active layer of the device to create quantum well structures and layers in which electron mobility is high.

In monolithic microwave integrated circuits, several switching circuit types are known. The first switching type so-called passive switches include series and shunt coupled field effect transistors which are operated in a resistive or passive mode. These elements commonly have source and drain electrodes interconnected to form series or shunt switching networks and have gate electrodes connected to gate bias voltages used as a control voltage to change the channel resistance between the source and the drain electrode. The gate bias voltage is switched between an on-state of the transistor and a pinch-off state of the transistor. In the first state of the transistor, the "on-state", a relatively low resistance between source and drain electrodes is provided whereas in the second state, "the off-state", a relatively high resistance between source and drain electrodes is provided. In actual practice, the characteristic of the field effect transistor in both the off-state and the on-state is more complicated than a simple high resistance and low resistance described. In the on-state, the field effect transistor at microwave frequencies is modelled as a series resistance-inductance circuit. The resistance in this circuit is the so-called on-state resistance of the channel and source and drain contact resistances, and the inductance of this circuit is a parasitic inductance resulting from the size of the FET. The presence of the inductance makes impedance matching in the on-state of the field effect transistor more difficult. When the FET is in an off-state, the FET is modelled between the source and drain electrodes as a series resistance-inductance capacitance circuit. It is desireable in this state that the capacitance be as small as possible to prevent coupling of the signal from the drain to source electrodes. The presence of the parasitic inductance effectively increases the capacitive susceptance, particularly in the shunt configuration which permits more energy to be coupled into the resistance and provides more loss in the off-state of the field effect transistor. The advantage of passive switches is that they are relatively broadband. This advantage is achieved, however, at the expense of relatively high insertion loss due to the aforementioned parasitics.

A second type of switch is the so-called active switch in which gate and drain biases are provided to field effect transistors arranged to provide switching circuits. This type of switching circuit has the advantage of providing gain to the signal. This advantage comes at the expense of increased circuit complexity and circuit fabrication complexity relatively moderate power handling and bandwidth capabilities.

One problem which is common to both types of switches is the relatively large size of the FETS employed in each of the switch implementations. Conventionally used switching FETS are MESFET's having a topography which has been adapted from active power FET designs. Although such a FET performs adequately as a switching FET, in general it has some drawbacks which have heretofore limited the ability of artisians to integrate these FETS into higher order passive switches. It would be desireable to provide higher order active switching implementations such as 1×4, 2×4, and 4×4 switches on a single integrated circuit. Generally, such higher order implementation are not feasible, unless individual chips are connected together in a hybrid type of arrangement.

The conventional field effect transistor 20, as shown in FIG. 1, includes a substrate 22 having a ground plane 21 disposed over a first surface thereof, and disposed over a second surface thereof, an optional buffer layer 23. Disposed over the optional buffer layer 23 is typically an epitaxially grown and etched mesa structure 25. The mesa structure 25 includes an active layer 24a which has an n-type dopant concentration typically in the range of $10^{16}$ to $10^{18}$ carriers per cubic centimeter and optional contact regions 24b which typically are highly doped n-type having a dopant concentration in excess of about $10^{18}$ carriers per cubic centimeter. Alternatively, ion implanted, etched and isolated active regions may also be used. In keeping with conventional power FET structure design, a plurality of gate fingers are disposed to make Schottky barrier contact with the active layer 24a, as shown for example in FIG. 1. The plurality of gate fingers are connected to a common gate bus 27, as also shown. The gate fingers are used to space source regions 28a, 28b from interdigitated drain regions 26a–26c as shown and to provide a plurality of parallel field effect transistor cells. The interdigitated drain regions are connected to a drain contact 26 as also shown, but the source regions 28a–28b must be connected to the common source electrode 28 through an airbridge or overlay structure 29a, 29b as depicted in FIG. 1B. It is the presence of the overlay structure 29a–29b as shown in FIG. 1 or other source overlay structures as also known to one of skill in the art which complicate the fabrication of such switching FETS.

In power FET designs, the gate fingers are connected in parallel to minimize gate resistance. This is an important consideration for a power FET, since an input signal is fed to the gate electrode, and a relatively high gate resistance would result in input signal attenuation, reduced gain and frequency cut off.

However, since no r.f. signals are coupled to the gate electrodes in passive switching applications, this consideration should not be important for passive switching FETS. Moreover, as also shown in FIG. 1, the interconnections for the gate fingers, the interdigitated drain fingers, and the source pads occur off the mesa portion of the chip. This arrangement is also required in high power MESFETS in order to provide requisite FET parameters in these applications such as breakdown voltages and low leakage currents. Accordingly, by using conventional power FET approaches for switching MESFETS, the presence of the parallel gate fingers, the source overlay structures, and interconnections of gate electrodes, drain electrodes, and source electrodes to common gate, drain, and source pads which are disposed off the mesa unnecessarily increase the size and hence, parasitics, complexity, and fabrication difficulties of FETS when used as passive switches. This in turn limits their r.f. performance capabilities and also limits the degree to which the structures may be easily integrated to form higher order passive switches such as 1×4, 2×2, and 2×4 switching implementations.

SUMMARY OF THE INVENTION

In accordance with the present invention, a field effect transistor includes an active region having a selected dopant concentration, a first plurality of spaced drain electrode portions disposed on said active region, and a second plurality of spaced source electrode portions disposed on said active region, with said source regions interdigitated with said drain regions. A meandered, gate electrode is disposed on said active layer spaced between source and drain regions. The gate electrodes comprises a metal which when deposited on the active layer forms a Schottky barrier contact with the active layer. With this particular arrangement, by providing a meandered gate electrode between interdigitated source and drain electrodes, rather than the conventional parallel gate finger structure of the conventional FET, a more compact, smaller structure is provided. Since the device is smaller, the FET size is reduced and the parasitics are reduced concomitantly therewith. This improves the r.f. performance characteristics of the device. Furthermore, since the device is reduced in size, more of these FET structures may be integrated on a single chip to provide higher order passive switching FET circuits. Furthermore, the meandered line disposed between source and drain electrodes eliminates the need for the airbridges for the source contacts, thereby eliminating the fabrication difficulties encountered with conventional passive FET switch designs.

In accordance with a further aspect of the present invention, a metal electrode field effect transistor for use in a passive radio frequency switch comprises a substrate comprising gallium arsenide, an active layer comprising doped gallium arsenide supported by said substrate, a first plurality of drain electrode portions disposed in ohmic contact over said active layer and spaced along said active layer, a second plurality of source electrode portions disposed in ohmic contact over said active layer, spaced along said active layer and spaced from said drain electrode portions to provide gate regions of said active layer between said spaced source and drain regions. A meandered, continuous gate electrode is disposed in Schottky barrier contact on said active layer in said gate regions of said active layer. With such an arrangement, by providing a plurality of source and drain electrode portions in ohmic contact on said active layer and a single meandered gate electrode between said source and drain electrodes, a more compact r.f. switch structure is provided, having lower parasitics and hence, improved r.f. performance which may be more highly integrated to form higher order switching circuits on a common substrate.

In accordance with a still further aspect of the invention, an r.f. switch controlled by a voltage bias signal fed to the switch having an input terminal and a pair of output terminals comprises a plurality of transistors, each transistor having source, drain, and gate electrodes arranged to provide a relatively low impedance path between said input and a first one of said pair of output terminals and a relatively high impedance path between said input and the second one of said output terminals in response to a first state of said control signal, and a relatively low impedance path between said input and said second one of said output terminals, and a relatively high impedance path between said input and said first one of said output terminals in response to a second different state of said control signal. Each one of said transistors includes a plurality of source electrodes and a plurality of drain electrodes disposed in ohmic contact over active regions of the transistor, with a single meandered gate electrode disposed in ohmic contact with said active layer and between said plurality of source electrodes and drain electrodes. With this particular arrangement, r.f. switches having a more compact structure are provided by use of the more compact FET layout. Further, since the FET size is smaller, the undesireable parasitics particularly inductance between source and drain electrodes is reduced, thereby improving r.f. performance.

BRIEF DESCRIPTION OF THE DRAWINGS

The foregoing features of this invention, as well as the invention itself, may be more fully understood from the following detailed description of the drawings, in which:

FIG. 2 is a schematic representation of a signal pole, double-throw switch (1×2 switch) comprised of a plurality of series and shunt interconnected field effect transistors;

FIG. 2A is a schematic representation of the switch of FIG. 2 when an input signal is coupled between an input terminal and a first output terminal of the switch;

FIG. 2B is a simplified equivalent circuit of that shown in FIG. 2A;

DESCRIPTION OF THE PREFERRED EMBODIMENTS

Figure 1A:
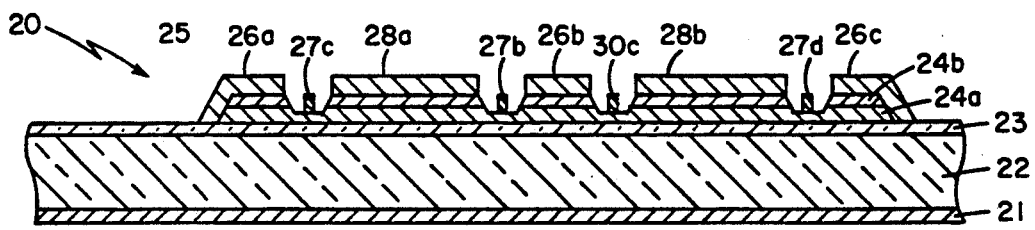
FIG. 1A is a cross-sectional view taken along line 1A—1A of FIG. 1.
Figure 1B:
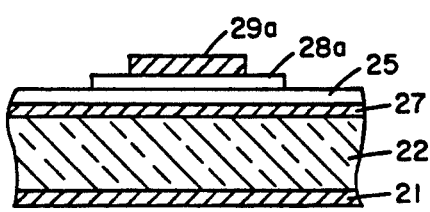
FIG. 1B is a cross-sectional view of FIG. 1 taken along line of 1B—1B of FIG. 1.

Referring now to FIGS. 2, 2A, and 2B, a signal pole, double-throw switch (2×1 switch) 10 is shown to include a common terminal 12 and a pair of branched terminals 14 and 17. Switch 10 is a bi-directional switch, that is energy can be switched between terminal 12 and 14 or reversed from terminal 14 to terminal 12 and likewise between terminal 12 and 16 or reversed between terminal 16 and 12. Switch 10 includes a pair of series connected transistors FET 11 and FET 21 disposed in a pair of branches of the switch. FET 11 is disposed in a first branch 10a of switch 10 and has a first one of drain and source electrodes connected to transmission line T1 and has the second one of drain and source electrodes connected to a transmission line T12 and a first one of drain and source electrodes of a shunt mounted FET 12, as also shown. The second one of drain and source electrodes of FET 12 is connected to ground. Transmission line T12 is connected to a first one of drain and source electrodes of a third transistor FET 12 having the second one of drain and source electrodes also coupled to ground as shown. The first one of drain and source electrodes of FET 13 is connected to a third transmission line T13, which is coupled to the first branch port 14. Likewise, the second channel 10b of the switch includes transistors FET 21, FET 22, FET 23 connected in a corresponding manner, as that described above for channel 10a. The gate electrodes of each one of the transistors FET 11-FET 13, and FET 21-FET 23 are connected by corresponding bias resistors $R_{G11}$-$R_{G13}$ and $R_{G21}$-$R_{G23}$ and are fed by one of a pair of control signals from terminals 15a and 15b. Control signals fed to terminals 15a and 15b are selected to place one set of the transistors, in an "off-state", whereas the other one of the control signals is selected to place the other set of the transistors in an "on-state" during selected modes of operation of the switch.

As exemplary one of such modes of operation is shown in the equivalent circuit of FIG. 2A, here signals are coupled between terminal 14, and terminal 12. Transistors FET 11, FET 22, and FET 23 are fed a bias signal from terminal 15b which places said transistors in an "on-state". Transistors FET 12, FET 13, and FET 21 are fed a bias signal which places said transistors in an "off-state". The equivalent circuit for the transistors in the "on-state" is represented by a parasitic inductance L of the transistor in the "on-state", and a resistance $R_{ON}$ corresponding to the on-state channel resistance of the transistor. The equivalent circuit for the transistors in the "off-state" is represented by a parasitic inductor L, capacitance $C_{OFF}$ and resistance $R_{OFF}$ connected in series between a common node and ground.

Ideally, the values of $R_{ON}$ are approximately equal to 0, the values of $C_{OFF}$ are very small, and the values of L are also small. FIG. 2B may be used to represent a simplified equivalent circuit as that shown in FIG. 2A, where the resistance $R_2'$ is equal to $R_{OFF21}+(R_{ON22}$ // $R_{ON23}$ // 50Ω), when // denotes "in parallel with". Thus, at port 16 isolation is provided at low frequencies by the off-state capacitance characteristic of the series FET 21 ($C_{OFF21}$) and at higher frequencies, the isolation is provided by the on-state resistances $R_{ON22}$, $R_{ON23}$ of the shunt mounted transistors FET 22 and FET 23.

Figure 1:
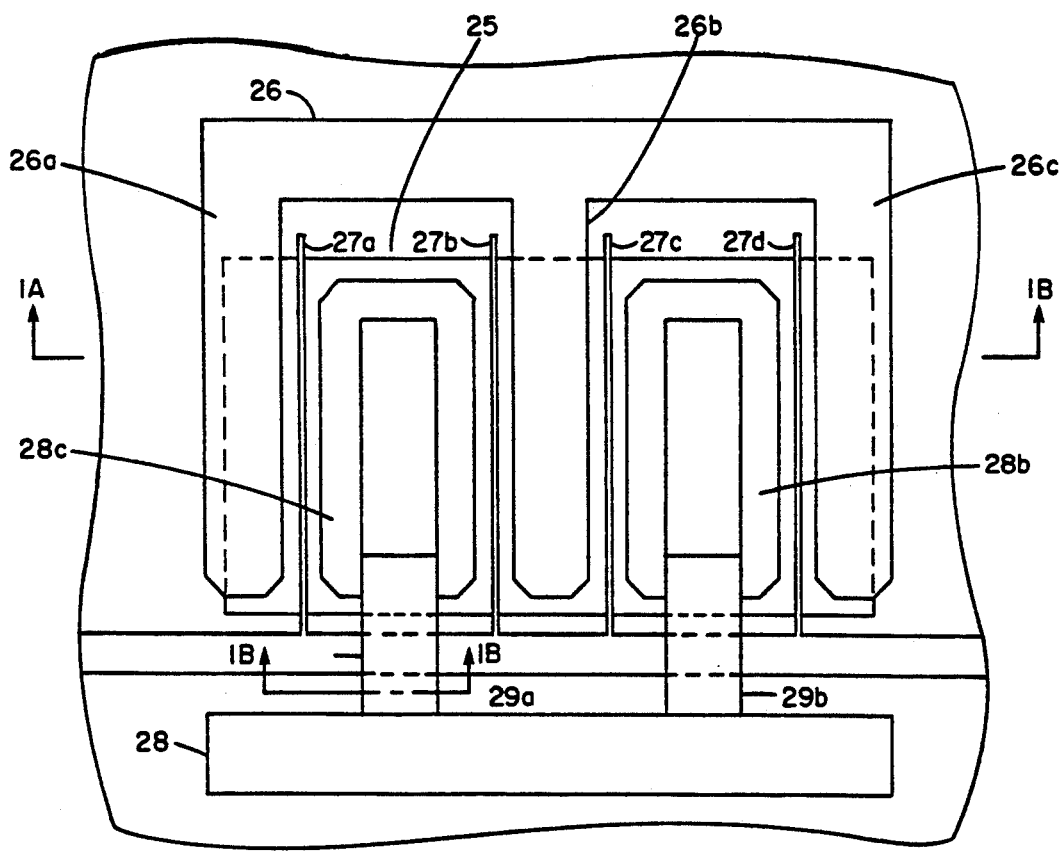
FIG. 1 is a plan view of a conventional metal electrode semiconductor field effect transistor.
Figure 3A:
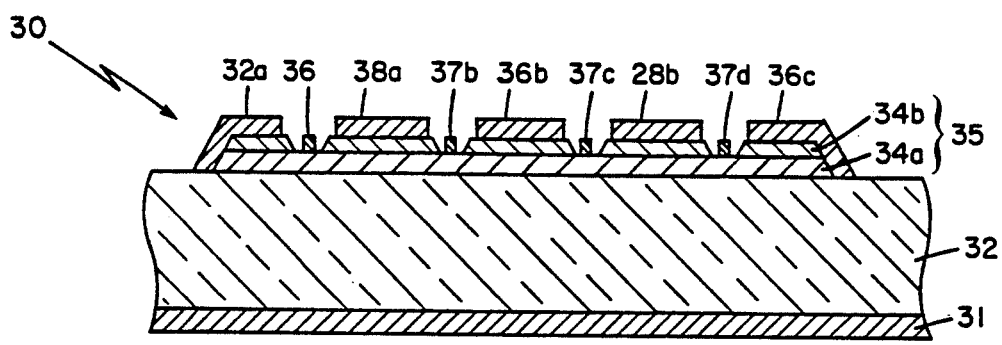
FIG. 3A is a cross-sectional view taken along line 3A—3A of FIG. 3.
Figure 3:
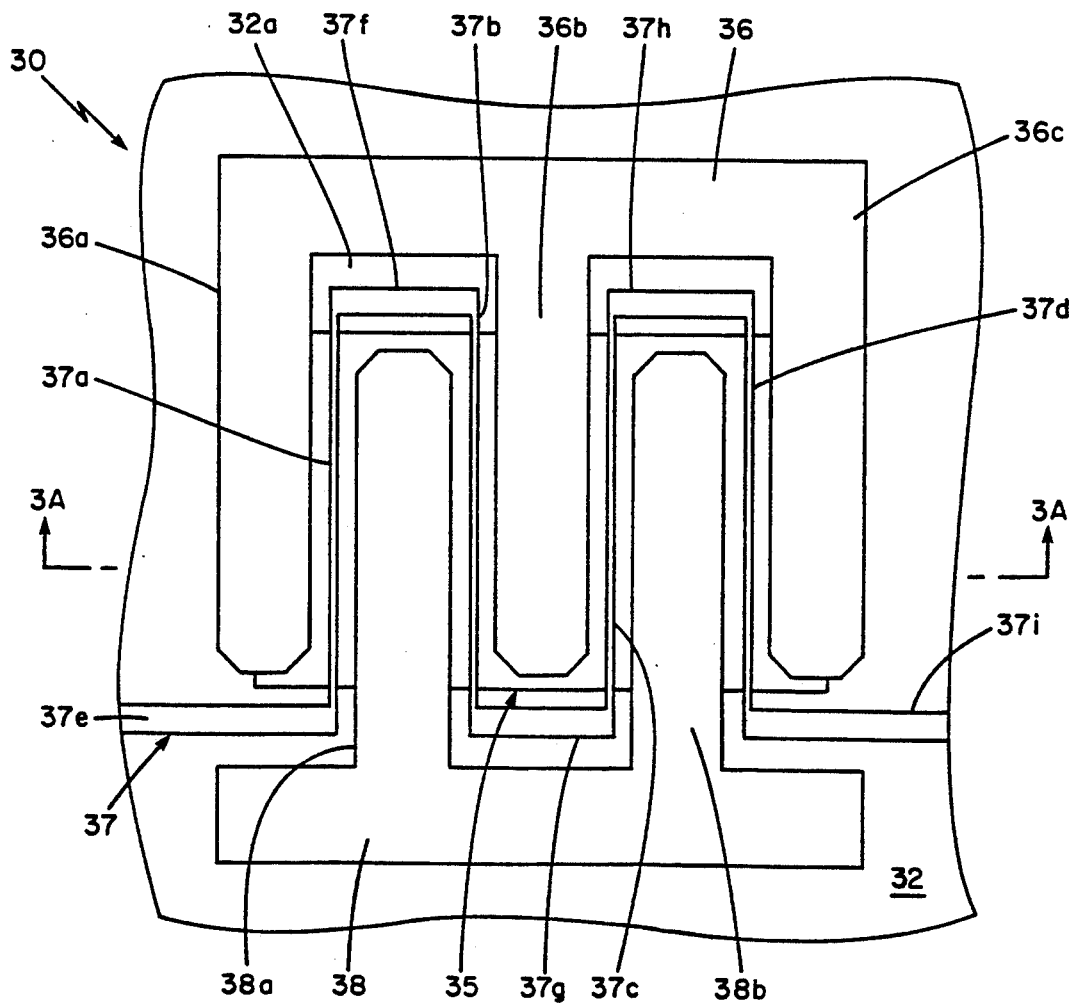
FIG. 3 is a plan view of a field effect transistor having a meandered gate electrode in accordance with a first aspect of the present invention.

Referring now to FIG. 3 and FIG. 3A, a metal electrode semiconductor field effect transistor structure particularly suited for use for preferably each of the transistors FET 11—FET 13 and FET 21—FET 23 is shown to include a substrate 32 here comprised of gallium arsenide or other suitable material for use at microwave frequencies. Supported over the substrate 32 on surface 32c thereof is an active region 35 here epitaxially grown and etched to provide a mesa including an active layer 34a having a n-type dopant concentration in the range of $10^{16}$ to $10^{18}$ carriers/cc and a contact layer 34b having an n+ type dopant concentration in the range of $10^{18}$ to $5\times10^{18}$ carriers/cc. Although an epitaxially grown mesa etched structure is shown and described, it will become apparent to one of skill in the art that ion implanted, annealed, and isolated structures may alternatively be used with the following device. Disposed on portions of the active layer 35 and in particular over the contact regions 34b thereof are a first plurality of drain electrode portions 36a–36c connected to a common drain electrode 36 disposed off of the active region 35, and spaced, interdigitated source electrode portions 38a–38b which are connected to common source electrode 38 disposed off of the active region 35 as shown. Disposed through a channel provided between adjacent, spaced drain and source electrode portions is a meandered gate line 37 comprised of gate sections 37a–37d which are in Schottky barrier contact with the active layer 34a between the source and drain electrode portions, and which are connected in series by sections 37e–37i which run perpendicular to the direction of the source and drain electrode portions and are disposed off of the mesa 35 on the substrate 32. Thus, a single common meandered gate electrode 37 is provided in Schottky barrier contact with the active layer and provides a MESFET structure which is simpler to use in a switching configuration. Gate electrode 37 includes a Schottky barrier forming metal layer (not shown) such as titanium or alternatively as aluminum, a diffusion barrier layer (not shown) such as platinum, and gold as the conductive layer 37. In particular, since the switch as described in conjunction with FIG. 2, is a passive switch requiring no drain or source bias and with no r.f. signal being applied to the gate electrode, input signal attenuation, reduced gain, and low frequency cut-off which would otherwise occur with such a series connected gate electrode 37 are unimportant. Thus, the series connected meandered gate electrodes are advantageous to use in this configuration of the MESFET. The need for the airbridge overlays to interconnect the source electrode portions 38a, 38b with the source electrode 38 as the FET of FIG. 1 are eliminated. The transistor structure shown in FIG. 3 is easier to fabricate than the transistor structure of FIG. 1; and therefore higher yields of switches employing this transistor structure would be expected from such an arrangement.

Figure 4A:
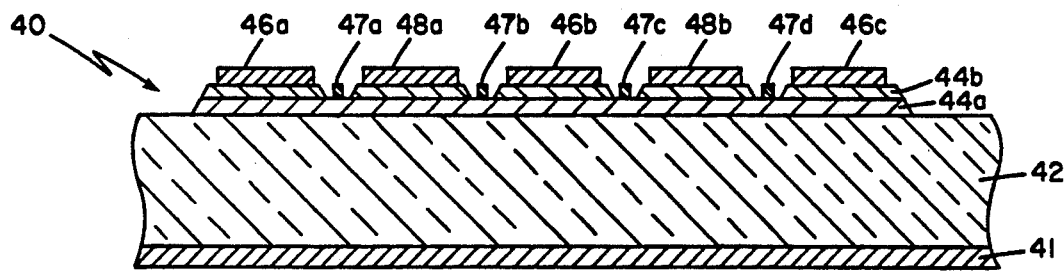
FIG. 4A is a cross-sectional view taken along line 4A—4A of FIG. 4.
Figure 4:
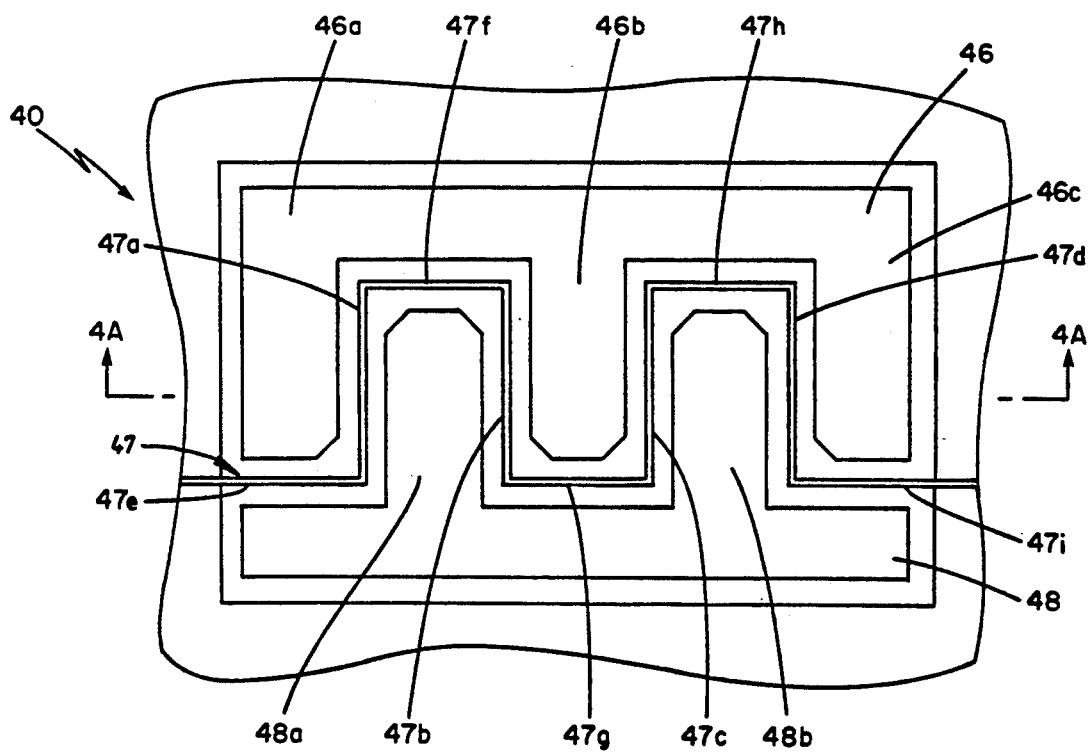
FIG. 4 is a plan view of a field effect transistor having a meandered gate electrode and drain and source electrodes disposed completely on the active portion of the transistor in accordance with a further aspect of the present invention.
Figure 5:
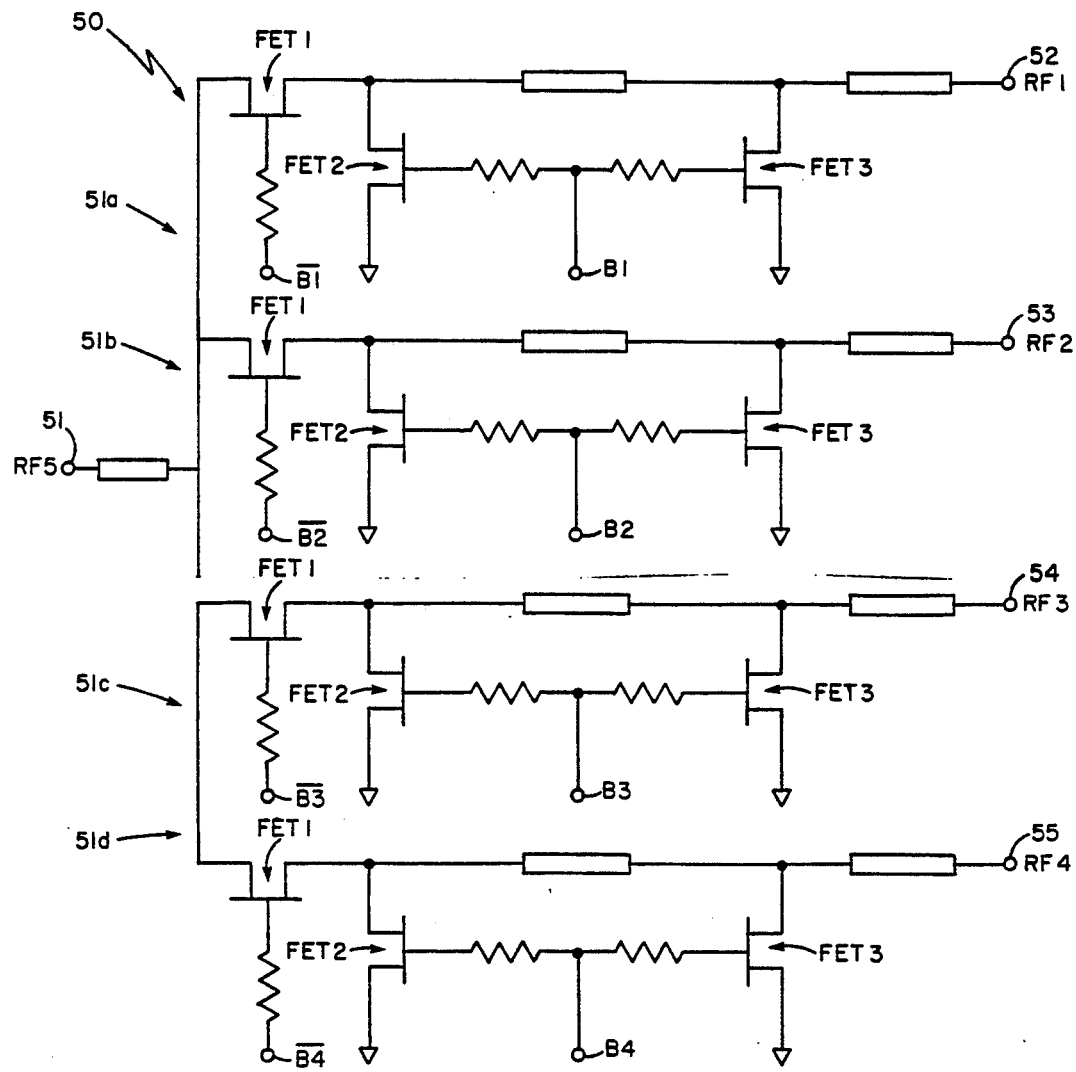
FIG. 5 is a schematic representation of a single pole, four-throw switch (1×4) using series and shunt FETs in accordance with a further aspect of the present invention.

Referring now to FIG. 4, an alternate embodiment of the present invention is shown to include a substrate 42 having a ground plane conductor 41 disposed over a first surface thereof and disposed over a second surface thereof, a mesa etched epitaxially grown active region 45, comprised of an active layer 44a having a dopant concentration as described for layer 34a above and a contact layer 44b similarly having a dopant concentration as described above for layer 34b. Disposed over layer 44b are source and drain electrode portions 46a–46c and 48a–48b respectively, as generally described in conjunction with FIG. 3 for regions 36a–36c and 38a–38b. Here, however, the source electrode portions 48a, 48b and drain electrode portions 46a–46c are connected to a common source electrode 48 and drain electrode 46, each of which are disposed on the mesa 45. A gate electrode 47 is meandered through a channel provided between the interdigitated source electrode portions 48a, 48b and drain electrode portions 46a–46c. Gate electrode 47 inlcudes parallel disposed portions 47a–47d interconnected by serial disposed poritons 47e–47i, as shown. Here, gate electrode 47 is a single, continuous electrode disposed on the active layer 44a except at the ends thereof where it may be connected or may be integrated with other components such as a bias line section as described in conjunction with FIG. 3. By placing all the interconnections for source, drain electrodes, and the single continuous gate on the active portion of the transistor, a structure is provided which is substantially smaller than the structure shown in FIG. 3 and in particular the structure shown in FIG. 1 while eliminating the airbridge overlay as required for the structure of FIG. 1. Therefore, a small field effect transistor which is substantially simpler to fabricate and suitable for passive switching is provided.

The transistors shown in FIG. 3 and 4 each will have lower parasitic reactances, in particular a lower parasitic inductance in both the "on-state" and "off-state" due to the reduced size of the field effect transistor. With such transistors provided in the switching circuits as shown in FIG. 2 for example 1×4 or 2×4 switches, highly integrated r.f. switches based upon passive connected field effect transistors may be provided.

Having described preferred embodiments in the invention, it will now become apparent to one of the skill in the art that other embodiments incorporating their concepts may be used. It is felt, therefore, that these embodiments should not be limited to disclosed embodiments, but rather should be limited only to by the spirit and scope of the appended claims.

What is claimed is:

1. An r.f. switch having a common terminal and at least a pair of branch terminals comprising:
   a plurality of metal semiconductor field effect transistors, each transistor having source, drain, and gate electrodes arranged to provide a low impedance path between said common terminal and a first one of said branch terminals and a high impedance path between said common terminal and a second one of said branch terminals in response to a first state of a control signal fed to the gate electrode of said transistors, and a low impedance path between said second branch terminal and said common terminal and a high impedance path between said common terminal and said first branch terminal in response to a second, different state control signal fed to the gate electrodes of said transistors, each of said metal semiconductor field effect transistors comprising:
   an active region, comprising doped gallium arsenide supported by said substrate;
   a plurality of drain electrode portions disposed in ohmic contact over said active region and spaced along said active region;
   a second plurality of source electrode portions disposed in ohmic contact over said active region and spaced along said active region from said electrode portions to provide gate regions of said active layer;
   a third plurality of gate electrodes extending along a first direction and disposed in Schottky barrier contact with said active region, with each one of said third plurality of gate electrodes having first and second ends and each of said electrodes being disposed on one of said gate regions of said active region; and
   a plurality of interconnect sections extending along a direction perpendicular to the first direction and disposed between the source and drain electrodes in Schottky barrier contact with said active region, to interconnect said third plurality of gate electrodes in a series circuit, with a first one of said pluraliyt of interconnect sections, connected between respective first ends of an adjacent pair of said third plurality of gate electrodes, and with a second one of said plurality of interconnect sections connected to a second end of one of said pair of adjacent gate electrodes and to a corresponding second end of a succeeding one of said plurality of gate electrodes disposed adjacent said one of said pair of adjacent gate electrodes, said gate electrodes and interconnecting sections controlling the flow of carriers between the source and drain electrodes in both the first direction and in the direction perpendicular to the first direction.

2. The transistor as recited in claim 1 wherein the plurality of drain electrode portions are connected to a common drain electrode and wherein the plurality of source electrode portions are connected to a common source electrode.

* * * * *